(12) United States Patent
Getz, Jr. et al.

(10) Patent No.: US 6,749,010 B2
(45) Date of Patent: Jun. 15, 2004

(54) COMPOSITE HEAT SINK WITH METAL BASE AND GRAPHITE FINS

(75) Inventors: George Getz, Jr., Parma Heights, OH (US); Michael Frastaci, Parma, OH (US)

(73) Assignee: Advanced Energy Technology Inc., Wilmington, DE (US)

( * ) Notice: Subject to any disclaimer, the term of this patent is extended or adjusted under 35 U.S.C. 154(b) by 0 days.

(21) Appl. No.: 10/184,841

(22) Filed: Jun. 28, 2002

(65) Prior Publication Data

US 2004/0000391 A1 Jan. 1, 2004

(51) Int. Cl.[7] .................................................. F28F 7/00
(52) U.S. Cl. ...................... 165/80.3; 165/185; 361/697; 361/704
(58) Field of Search ................................ 165/80.3, 185, 165/104.33; 361/697, 704, 710; 428/408

(56) References Cited

U.S. PATENT DOCUMENTS

| | | | | | |
|---|---|---|---|---|---|
| 3,913,666 | A | * | 10/1975 | Bayliss | 165/104.33 |
| 4,867,235 | A | * | 9/1989 | Grapes et al. | 165/185 |
| 5,077,637 | A | * | 12/1991 | Martorana et al. | 165/185 |
| 5,390,734 | A | * | 2/1995 | Voorhes et al. | 165/185 |
| 6,085,830 | A | * | 7/2000 | Mashiko et al. | 165/80.3 |
| 6,503,626 | B1 | * | 1/2003 | Norley et al. | 428/408 |
| 2002/0108743 | A1 | * | 8/2002 | Wirtz | 165/80.3 |
| 2002/0157818 | A1 | * | 10/2002 | Norley et al. | 165/185 |

* cited by examiner

Primary Examiner—Terrell McKinnon
(74) Attorney, Agent, or Firm—Waddey & Patterson; James R. Cartiglia

(57) ABSTRACT

A composite heat sink apparatus includes a metal base which has a thermal conductivity of at least about 200 W/m°K. The metal base is preferably constructed either of copper of aluminum. The heat sink apparatus further includes a plurality of fins attached to the base, the fins being constructed of anisotropic graphite material having a direction of relatively high thermal conductivity perpendicular to the base.

10 Claims, 1 Drawing Sheet

COMPOSITE HEAT SINK WITH METAL BASE AND GRAPHITE FINS

TECHNICAL FIELD

The present invention relates to a heat sink capable of managing the heat from a heat source such as an electronic device.

BACKGROUND OF THE INVENTION

With the development of more and more sophisticated electronic devices, including those capable of increasing processing speeds and higher frequencies, having smaller size and more complicated power requirements, and exhibiting other technological advances, such as microprocessors and integrated circuits in electronic and electrical components and systems as well as in other devices such as high power optical devices, relatively extreme temperatures can be generated. However, microprocessors, integrated circuits and other sophisticated electronic components typically operate efficiently only under a certain range of threshold temperatures. The excessive heat generated during operation of these components can not only harm their own performance, but can also degrade the performance and reliability of the overall system and can even cause system failure. The increasingly wide range of environmental conditions, including temperature extremes, in which electronic systems are expected to operate, exacerbates the negative effects of excessive heat.

With the increased need for heat dissipation from microelectronic devices, thermal management becomes an increasingly important element of the design of electronic products. Both performance reliability and life expectancy of electronic equipment are inversely related to the component temperature of the equipment. For instance, a reduction in the operating temperature of a device such as a typical silicon semiconductor can correspond to an increase in the processing speed, reliability and life expectancy of the device. Therefore, to maximize the life-span and reliability of a component, controlling the device operating temperature within the limits set by the designers is of paramount importance.

Several types of heat dissipating components are utilized to facilitate heat dissipation from electronic devices. The present invention is directly applicable to finned heat sinks.

These heat sinks facilitate heat dissipation from the surface of a heat source, such as a heat-generating electronic device, to a cooler environment, usually air. The heat sink seeks to increase the heat transfer efficiency between the electronic device and the ambient air primarily by increasing the surface area that is in direct contact with the air or other heat transfer media. This allows more heat to be dissipated and thus lowers the electronic device operating temperature. The primary purpose of a heat dissipating component is to help maintain the device temperature below the maximum allowable temperature specified by its designer/manufacturer.

Typically, the heat sinks are formed of a metal, especially copper or aluminum, due to the ability of metals like copper to readily absorb heat and transfer it about its entire structure. Copper heat sinks are often formed with fins or other structures to increase the surface area of the heat sink, with air being forced across or through the fins (such as by a fan) to effect heat dissipation from the electronic component, through the copper heat sink and then to the air.

The use of copper or aluminum heat dissipating elements can present a problem because of the weight of the metal, particularly when the heat transmitting area of the heat dissipating component is significantly larger than that of the electronic device. For instance, pure copper weighs 8.96 grams per cubic centimeter ($g/cm^3$) and pure aluminum weighs 2.70 $g/cm^3$.

For example, in many applications, several heat sinks need to be arrayed on, e.g., a circuit board to dissipate heat from a variety of components on the board. If metallic heat sinks are employed, the sheer weight of the metal on the board can increase the chances of the board cracking or of other equally undesirable effects, and increases the weight of the component itself. For portable electronic devices, any method to reduce weight while maintaining heat dissipation characteristics is especially desirable.

Another group of materials suitable for use in heat sinks are those materials generally known as graphites, but in particular graphites such as those based on natural graphites and flexible graphite as described below. These materials are anisotropic and allow the heat sink to be designed to preferentially transfer heat in selected directions. Also, the graphite materials are much lighter in weight and thus provide many advantages over copper or aluminum.

Graphites are made up of layer planes of hexagonal arrays or networks of carbon atoms. These layer planes of hexagonally arranged carbon atoms are substantially flat and are oriented or ordered so as to be substantially parallel and equidistant to one another. The substantially flat, parallel equidistant sheets or layers of carbon atoms, usually referred to as graphene layers or basal planes, are linked or bonded together and groups thereof are arranged in crystallites. Highly ordered graphites consist of crystallites of considerable size: the crystallites being highly aligned or oriented with respect to each other and having well ordered carbon layers. In other words, highly ordered graphites have a high degree of preferred crystallite orientation. It should be noted that graphites possess anisotropic structures and thus exhibit or possess many properties that are highly directional e.g. thermal and electrical conductivity and fluid diffusion.

Briefly, graphites may be characterized as laminated structures of carbon, that is, structures consisting of superposed layers or laminae of carbon atoms joined together by weak van der Waals forces. In considering the graphite structure, two axes or directions are usually noted, to wit, the "c" axis or direction and the "a" axes or directions. For simplicity, the "c" axis or direction may be considered as the direction perpendicular to the carbon layers. The "a" axes or directions may be considered as the directions parallel to the carbon layers or the directions perpendicular to the "c" direction. The graphites suitable for manufacturing flexible graphite sheets possess a very high degree of orientation.

As noted above, the bonding forces holding the parallel layers of carbon atoms together are only weak van der Waals forces. Natural graphites can be treated so that the spacing between the superposed carbon layers or laminae can be appreciably opened up so as to provide a marked expansion in the direction perpendicular to the layers, that is, in the "c" direction, and thus form an expanded or intumesced graphite structure in which the laminar character of the carbon layers is substantially retained.

Graphite flake which has been greatly expanded and more particularly expanded so as to have a final thickness or "c" direction dimension which is as much as about 80 or more times the original "c" direction dimension can be formed without the use of a binder into cohesive or integrated sheets of expanded graphite, e.g. webs, papers, strips, tapes, foils, mats or the like (typically referred to as "flexible graphite").

The formation of graphite particles which have been expanded to have a final thickness or "c" dimension which is as much as about 80 times or more the original "c" direction dimension into integrated flexible sheets by compression, without the use of any binding material, is believed to be possible due to the mechanical interlocking, or cohesion, which is achieved between the voluminously expanded graphite particles.

In addition to flexibility, the sheet material, as noted above, has also been found to possess a high degree of anisotropy with respect to thermal and electrical conductivity and fluid diffusion, comparable to the natural graphite starting material due to orientation of the expanded graphite particles and graphite layers substantially parallel to the opposed faces of the sheet resulting from very high compression, e.g. roll pressing. Sheet material thus produced has excellent flexibility, good strength and a very high degree of orientation.

Briefly, the process of producing flexible, binderless anisotropic graphite sheet material, e.g. web, paper, strip, tape, foil, mat, or the like, comprises compressing or compacting under a predetermined load and in the absence of a binder, expanded graphite particles which have a "c" direction dimension which is as much as about 80 or more times that of the original particles so as to form a substantially flat, flexible, integrated graphite sheet. The expanded graphite particles that generally are worm-like or vermiform in appearance, once compressed, will maintain the compression set and alignment with the opposed major surfaces of the sheet. The density and thickness of the sheet material can be varied by controlling the degree of compression. The density of the sheet material can be within the range of from about 0.04 g/cm$^3$ to about 2.0 g/cm$^3$. The flexible graphite sheet material exhibits an appreciable degree of anisotropy due to the alignment of graphite particles parallel to the major opposed, parallel surfaces of the sheet, with the degree of anisotropy increasing upon roll pressing of the sheet material to increase orientation. In roll pressed anisotropic sheet material, the thickness, i.e. the direction perpendicular to the opposed, parallel sheet surfaces comprises the "c" direction and the directions ranging along the length and width, i.e. along or parallel to the opposed, major surfaces comprises the "a" directions and the thermal, electrical and fluid diffusion properties of the sheet are very different, by orders of magnitude, for the "c" and "a" directions.

There is a continuing need for improved heat sink designs which provide relatively high thermal conductivity and relatively low weight as compared to prior designs.

SUMMARY OF THE INVENTION

The present invention provides a heat sink apparatus which comprises a metallic base having a thermal conductivity of at least about 200 W/m°K, and a plurality of fins attached to the base, the fins being constructed of anisotropic graphite material having a direction of relatively high thermal conductivity perpendicular to the base.

In specific embodiments of the invention the base may be constructed either of copper or aluminum.

Accordingly, it is an object of the present invention to provide an improved heat sink design for thermal management of electronic devices.

Still another object of the present invention is the provision of a composite heat sink design having a metal base and having fins constructed of anisotropic graphite material.

And another object of the present invention is the provision of a composite heat sink having a copper base with graphite fins, which provides a thermal performance approximately equal to that of an all copper heat sink while having a weight less than that of the all copper heat sink.

And another object of the present invention is the provision of a heat sink apparatus having an aluminum base and a plurality of graphite fins, so that the heat sink apparatus has a thermal performance greater than that of a similar sized all aluminum heat sink while having a weight no greater than that of the all aluminum heat sink.

Other and further objects, features, and advantages of the present invention will be readily apparent to those skilled in the art, upon a reading of the following disclosure when taken in conjunction with the accompanying drawings.

DETAILED DESCRIPTION OF THE PREFERRED EMBODIMENTS

Figure 1:
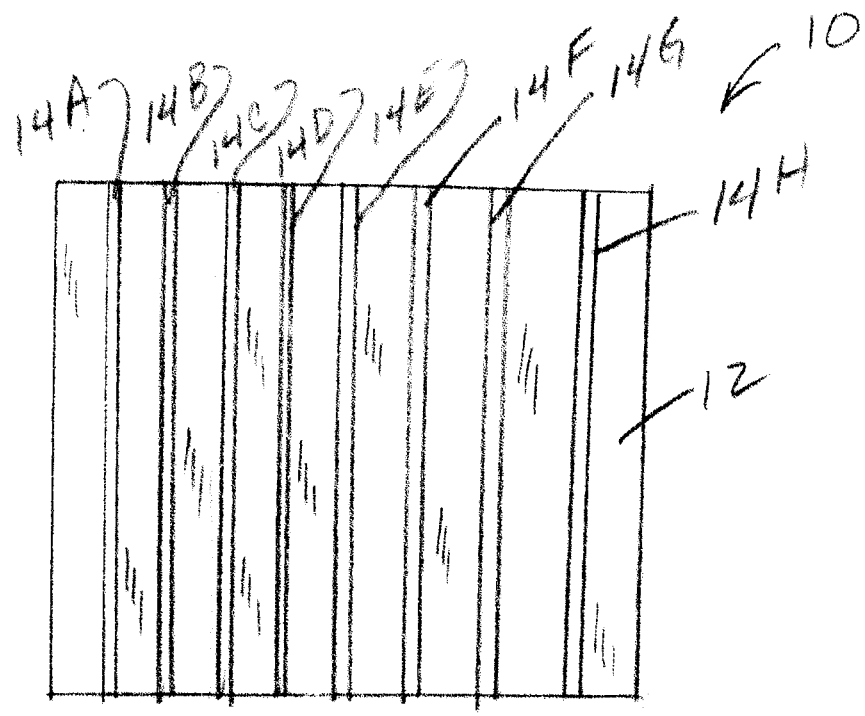
FIG. 1 is a schematic plan view of a heat sink constructed in accordance with the present invention.

As noted, one material from which the heat sinks of the present invention may be constructed is graphite sheet material. Before describing the construction of the heat sinks, a brief description of graphite and its formation into flexible sheets is in order.

Preparation of Flexible Graphite Sheet

Graphite is a crystalline form of carbon comprising atoms covalently bonded in flat layered planes with weaker bonds between the planes. By treating particles of graphite, such as natural graphite flake, with an intercalant of, e.g. a solution of sulfuric and nitric acid, the crystal structure of the graphite reacts to form a compound of graphite and the intercalant. The treated particles of graphite are hereafter referred to as "particles of intercalated graphite." Upon exposure to high temperature, the intercalant within the graphite decomposes and volatilizes, causing the particles of intercalated graphite to expand in dimension as much as about 80 or more times its original volume in an accordion-like fashion in the "c" direction, i.e. in the direction perpendicular to the crystalline planes of the graphite. The exfoliated graphite particles are vermiform in appearance, and are therefore commonly referred to as worms. The worms may be compressed together into flexible sheets that, unlike the original graphite flakes, can be formed and cut into various shapes.

Graphite starting materials suitable for use in the present invention include highly graphitic carbonaceous materials capable of intercalating organic and inorganic acids as well as halogens and then expanding when exposed to heat. These highly graphitic carbonaceous materials most preferably have a degree of graphitization of about 1.0. As used in this disclosure, the term "degree of graphitization" refers to the value g according to the formula:

$$g = \frac{3.45 - d(002)}{0.095}$$

where d(002) is the spacing between the graphitic layers of the carbons in the crystal structure measured in Angstrom units. The spacing d between graphite layers is measured by standard X-ray diffraction techniques. The positions of diffraction peaks corresponding to the (002), (004) and (006) Miller Indices are measured, and standard least-squares techniques are employed to derive spacing which minimizes the total error for all of these peaks. Examples of highly graphitic carbonaceous materials include natural graphites from various sources, as well as other carbonaceous materials such as graphite prepared by chemical vapor deposition, high temperature pyrolysis of polymers, or crystallization from molten metal solutions and the like. Natural graphite is most preferred.

The graphite starting materials used in the present invention may contain non-graphite components so long as the crystal structure of the starting materials maintains the required degree of graphitization and they are capable of exfoliation. Generally, any carbon-containing material, the crystal structure of which possesses the required degree of graphitization and which can be exfoliated, is suitable for use with the present invention. Such graphite preferably has a purity of at least about eighty weight percent. More preferably, the graphite employed for the present invention will have a purity of at least about 94%. In the most preferred embodiment, the graphite employed will have a purity of at least about 98%.

A common method for manufacturing graphite sheet is described by Shane et al. in U.S. Pat. No. 3,404,061, the disclosure of which is incorporated herein by reference. In the typical practice of the Shane et al. method, natural graphite flakes are intercalated by dispersing the flakes in a solution containing e.g., a mixture of nitric and sulfuric acid, advantageously at a level of about 20 to about 300 parts by weight of intercalant solution per 100 parts by weight of graphite flakes (pph). The intercalation solution contains oxidizing and other intercalating agents known in the art. Examples include those containing oxidizing agents and oxidizing mixtures, such as solutions containing nitric acid, potassium chlorate, chromic acid, potassium permanganate, potassium chromate, potassium dichromate, perchloric acid, and the like, or mixtures, such as for example, concentrated nitric acid and chlorate, chromic acid and phosphoric acid, sulfuric acid and nitric acid, or mixtures of a strong organic acid, e.g. trifluoroacetic acid, and a strong oxidizing agent soluble in the organic acid. Alternatively, an electric potential can be used to bring about oxidation of the graphite. Chemical species that can be introduced into the graphite crystal using electrolytic oxidation include sulfuric acid as well as other acids.

In a preferred embodiment, the intercalating agent is a solution of a mixture of sulfuric acid, or sulfuric acid and phosphoric acid, and an oxidizing agent, i.e. nitric acid, perchloric acid, chromic acid, potassium permanganate, hydrogen peroxide, iodic or periodic acids, or the like. Although less preferred, the intercalation solution may contain metal halides such as ferric chloride, and ferric chloride mixed with sulfuric acid, or a halide, such as bromine as a solution of bromine and sulfuric acid or bromine in an organic solvent.

The quantity of intercalation solution may range from about 20 to about 350 pph and more typically about 40 to about 160 pph. After the flakes are intercalated, any excess solution is drained from the flakes and the flakes are water-washed. Alternatively, the quantity of the intercalation solution may be limited to between about 10 and about 40 pph, which permits the washing step to be eliminated as taught and described in U.S. Pat. No. 4,895,713, the disclosure of which is also herein incorporated by reference.

The particles of graphite flake treated with intercalation solution can optionally be contacted, e.g. by blending, with a reducing organic agent selected from alcohols, sugars, aldehydes and esters which are reactive with the surface film of oxidizing intercalating solution at temperatures in the range of 25° C. and 125° C. Suitable specific organic agents include hexadecanol, octadecanol, 1-octanol, 2-octanol, decylalcohol, 1, 10 decanediol, decylaldehyde, 1-propanol, 1,3 propanediol, ethyleneglycol, polypropylene glycol, dextrose, fructose, lactose, sucrose, potato starch, ethylene glycol monostearate, diethylene glycol dibenzoate, propylene glycol monostearate, glycerol monostearate, dimethyl oxylate, diethyl oxylate, methyl formate, ethyl formate, ascorbic acid and lignin-derived compounds, such as sodium lignosulfate. The amount of organic reducing agent is suitably from about 0.5 to 4% by weight of the particles of graphite flake.

The use of an expansion aid applied prior to, during or immediately after intercalation can also provide improvements. Among these improvements can be reduced exfoliation temperature and increased expanded volume (also referred to as "worm volume"). An expansion aid in this context will advantageously be an organic material sufficiently soluble in the intercalation solution to achieve an improvement in expansion. More narrowly, organic materials of this type that contain carbon, hydrogen and oxygen, preferably exclusively, may be employed. Carboxylic acids have been found especially effective. A suitable carboxylic acid useful as the expansion aid can be selected from aromatic, aliphatic or cycloaliphatic, straight chain or branched chain, saturated and unsaturated monocarboxylic acids, dicarboxylic acids and polycarboxylic acids which have at least 1 carbon atom, and preferably up to about 15 carbon atoms, which is soluble in the intercalation solution in amounts effective to provide a measurable improvement of one or more aspects of exfoliation. Suitable organic solvents can be employed to improve solubility of an organic expansion aid in the intercalation solution.

Representative examples of saturated aliphatic carboxylic acids are acids such as those of the formula $H(CH_2)_n COOH$ wherein n is a number of from 0 to about 5, including formic, acetic, propionic, butyric, pentanoic, hexanoic, and the like. In place of the carboxylic acids, the anhydrides or reactive carboxylic acid derivatives such as alkyl esters can also be employed. Representative of alkyl esters are methyl formate and ethyl formate. Sulfuric acid, nitric acid and other known aqueous intercalants have the ability to decompose formic acid, ultimately to water and carbon dioxide. Because of this, formic acid and other sensitive expansion aids are advantageously contacted with the graphite flake prior to immersion of the flake in aqueous intercalant. Representative of dicarboxylic acids are aliphatic dicarboxylic acids having 2–12 carbon atoms, in particular oxalic acid, fumaric acid, malonic acid, maleic acid, succinic acid, glutaric acid, adipic acid, 1,5-pentanedicarboxylic acid, 1,6-hexanedicarboxylic acid, 1,10-decanedicarboxylic acid, cyclohexane-1,4-dicarboxylic acid and aromatic dicarboxylic acids such as phthalic acid or terephthalic acid. Representative of alkyl esters are dimethyl oxylate and diethyl oxylate. Representative of cycloaliphatic acids is cyclohexane carboxylic acid and of aromatic carboxylic acids are benzoic acid, naphthoic acid, anthranilic acid, p-aminobenzoic acid, salicylic acid, o-, m- and p-tolyl acids, methoxy and ethoxybenzoic acids, acetoacetamidobenzoic acids and, acetamidobenzoic acids, phenylacetic acid and naphthoic acids. Representative of hydroxy aromatic acids are hydroxybenzoic acid, 3-hydroxy-1-naphthoic acid, 3-hydroxy-2-naphthoic acid, 4-hydroxy-2-naphthoic acid, 5-hydroxy-1-naphthoic acid, 5-hydroxy-2-naphthoic acid, 6-hydroxy-2-naphthoic acid and 7-hydroxy-2-naphthoic acid. Prominent among the polycarboxylic acids is citric acid.

The intercalation solution will be aqueous and will preferably contain an amount of expansion aid of from about 1 to 10%, the amount being effective to enhance exfoliation. In the embodiment wherein the expansion aid is contacted with the graphite flake prior to or after immersing in the aqueous intercalation solution, the expansion aid can be admixed with the graphite by suitable means, such as a V-blender, typically in an amount of from about 0.2% to about 10% by weight of the graphite flake.

After intercalating the graphite flake, and following the blending of the intercalant coated intercalated graphite flake with the organic reducing agent, the blend is exposed to temperatures in the range of 25° to 125° C. to promote reaction of the reducing agent and intercalant coating. The heating period is up to about 20 hours, with shorter heating periods, e.g., at least about 10 minutes, for higher temperatures in the above-noted range. Times of one half hour or less, e.g., on the order of 10 to 25 minutes, can be employed at the higher temperatures.

The thus treated particles of graphite are sometimes referred to as "particles of intercalated graphite." Upon exposure to high temperature, e.g. temperatures of at least about 160° C. and especially about 700° C. to 1000° C. and higher, the particles of intercalated graphite expand as much as about 80 to 1000 or more times their original volume in an accordion-like fashion in the c-direction, i.e. in the direction perpendicular to the crystalline planes of the constituent graphite particles. The expanded, i.e. exfoliated, graphite particles are vermiform in appearance, and are therefore commonly referred to as worms. The worms may be compressed together into flexible sheets that, unlike the original graphite flakes, can be formed and cut into various shapes.

Flexible graphite sheet and foil are coherent, with good handling strength, and are suitably compressed, e.g. by roll pressing, to a thickness of about 0.075 mm to 3.75 mm and a typical density of about 0.1 to 1.5 grams per cubic centimeter ($g/cm^3$). From about 1.5–30% by weight of ceramic additives can be blended with the intercalated graphite flakes as described in U.S. Pat. No. 5,902,762 (which is incorporated herein by reference) to provide enhanced resin impregnation in the final flexible graphite product. The additives include ceramic fiber particles having a length of about 0.15 to 1.5 millimeters. The width of the particles is suitably from about 0.04 to 0.004 mm. The ceramic fiber particles are non-reactive and non-adhering to graphite and are stable at temperatures up to about 1100° C., preferably about 1400° C. or higher. Suitable ceramic fiber particles are formed of macerated quartz glass fibers, carbon and graphite fibers, zirconia, boron nitride, silicon carbide and magnesia fibers, naturally occurring mineral fibers such as calcium metasilicate fibers, calcium aluminum silicate fibers, aluminum oxide fibers and the like.

The flexible graphite sheet can also, at times, be advantageously treated with resin and the absorbed resin, after curing, enhances the moisture resistance and handling strength, i.e. stiffness, of the flexible graphite sheet as well as "fixing" the morphology of the sheet. Suitable resin content is preferably less than about 60% by weight, more preferably less than about 35% by weight, and most preferably from about 4% to about 15% by weight. Resins found especially useful in the practice of the present invention include acrylic-, epoxy- and phenolic-based resin systems, or mixtures thereof. Suitable epoxy resin systems include those based on diglycidyl ether or bisphenol A (DGEBA) and other multifunctional resin systems; phenolic resins that can be employed include resole and novolak phenolics.

Preparation of Laminated Graphite Materials

The graphite fins of the heat sinks described below are preferably constructed from a laminated resin impregnated graphite material in the manner set forth in U.S. patent application Ser. No. 09/943,131, filed Aug. 31, 2001 of Norley et al. entitled "LAMINATES PREPARED FROM IMPREGNATED FLEXIBLE GRAPHITE SHEETS", assigned to the assignee of the present invention, the details of which are incorporated herein by reference.

According to the Norley et al. process, flexible graphite sheets prepared as described above and having a thickness of about 4 mm to 7 mm are impregnated with a thermosetting resin such as an epoxy, acrylic or phenolic resin system. Suitable epoxy resins include diglycidyl ether of bisphenol A (DGEBA) resin systems; other multifunctional epoxy resins systems are also suitable for use in the present invention. Suitable phenolic resin systems include those containing resole and novolak resins. The sheets are then calendered to a thickness of about 0.35 mm to 0.5 mm, at which time the calendered, epoxy impregnated flexible mats have a density of about 1.4 $g/cm^3$ to about 1.9 $g/cm^3$.

The amount of resin within the epoxy impregnated graphite sheets should be an amount sufficient to ensure that the final assembled and cured layered structure is dense and cohesive, yet the anisotropic thermal conductivity associated with a densified graphite structure has not been adversely impacted. Suitable resin content is preferably at least about 3% by weight, more preferably from about 5% to about 35% by weight depending on the characteristics desired in the final product.

In a typical resin impregnation step, the flexible graphite sheet is passed through a vessel and impregnated with the resin system from, e.g. spray nozzles, the resin system advantageously being "pulled through the mat" by means of a vacuum chamber. Typically, but not necessarily, the resin system is solvated to facilitate application into the flexible graphite sheet. The resin is thereafter preferably dried, reducing the tack of the resin and the resin-impregnated sheet.

One type of apparatus for continuously forming resin-impregnated and calendered flexible graphite sheet is shown in International Publication No. WO 00/64808, the disclosure of which is incorporated herein by reference.

Following the calendering step, the impregnated sheets are cut to suitable-sized pieces which are stacked together and placed in a press, where they are cured at an elevated temperature. The temperature should be sufficient to ensure that the lamellar structure is densified at the curing pressure, improving the anisotropy of the structure and hence its thermal properties as a heat dissipating device. Generally, this will require a temperature of from about 150° C. to 200° C. The pressure employed for curing will be somewhat a function of the temperature utilized, but will be sufficient to ensure that the lamellar structure is densified without adversely impacting the thermal properties of the structure. Generally, for convenience of manufacture, the minimum required pressure to densify the structure to the required degree will be utilized. Such a pressure will generally be from 1000 to 3000 pounds per square inch (psi). The curing time may vary depending on the resin system and the temperature and pressure employed, but generally will range from 0.5 hours to 2 hours. After curing is complete, the composites are seen to have a density of from about 1.8 $g/cm^3$ to 2.0 $g/cm^3$.

Advantageously, the resin present in the impregnated sheets can act as the adhesive for the composite material. Alternatively the calendered, impregnated, flexible graphite sheets are coated with an adhesive before the flexible sheets are stacked and cured. Suitable adhesives include epoxy-, acrylic- and phenolic-based resins. Phenolic resins found especially useful in the practice of the present invention include phenolic-based resin systems including resole and novolak phenolics.

Optionally, non-graphite layers may be included in the pre-pressed stack. Such non-graphite layers may include metals, plastics or other non-metallics such as fiberglass or ceramics. The epoxy polymer in the impregnated graphite sheets is sufficient to, upon curing, adhesively bond the non-graphite as well as the impregnated graphite layers of the structure into place.

The following example is presented to further illustrate and explain the construction of suitable laminated structures and is not intended to be limiting in any regard. Unless otherwise indicated, all parts and percentages are by weight.

EXAMPLE 1

Graphite sheets with a weight per unit area of 70 mg/cm$^2$ with dimensions of approximately 30 cm by 30 cm were impregnated with epoxy such that the resulting calendered mats were 12 weight % epoxy. The epoxy employed was a diglycidyl ether of bisphenol A (DGEBA) elevated temperature cure formulation and the impregnation procedures involved saturation with an acetone-resin solution followed by drying at approximately 80° C. Following impregnation, the sheets were then calendered from a thickness of approximately 7 mm to a thickness of approximately 0.4 mm and a density of 1.63 g/cm$^3$. The calendered, impregnated sheets were then cut into disks with a diameter of approximately 50 mm and the disks were stacked 46 layers high. This stack of disks was then placed in a TMP (Technical Machine Products) press, and cured at 2600 psi at 150° C. for 1 hour. The resultant laminate had a density of 1.90 g/cm$^3$, a flexural strength of 8000 psi, a Young's modules of 7.5 Msi (millions of pounds per square inch) and an in plane resistivity of 6 microhm. The in-plane and through-thickness thermal conductivity values were 396 W/m°K and 6.9 W/m°K, respectively. The laminates exhibited superior machinability, had a continuous pore free surface with a smooth finish and were suitable for use in electronic thermal management devices. The highly anisotropic thermal conductivity resulted in a structure highly adapted for use in piping heat away from sensitive electronics and into a heat sink. In addition, the density of the material, approximately 1.94 g/cm$^3$, is considerably below aluminum (2.7 g/cm$^3$) and much less than copper (8.96 g/cm$^3$). Thus, the specific thermal conductivity (that is, the ratio of thermal conductivity to density) of the graphite laminate is about three times that of aluminum and about four to six times that of copper.

The laminated graphite materials suitable for use with the present invention are not limited to those specific ones described above, and may for example include a laminate comprised of layers of pyrolytic graphite sheet such as that manufactured by Matsushita Electric Components Co., Ltd. Ceramic Division, 1006 Kadoma, Osaka, Japan under the trade name Panasonic "PGS"® Graphite Sheet.

Figure 2:
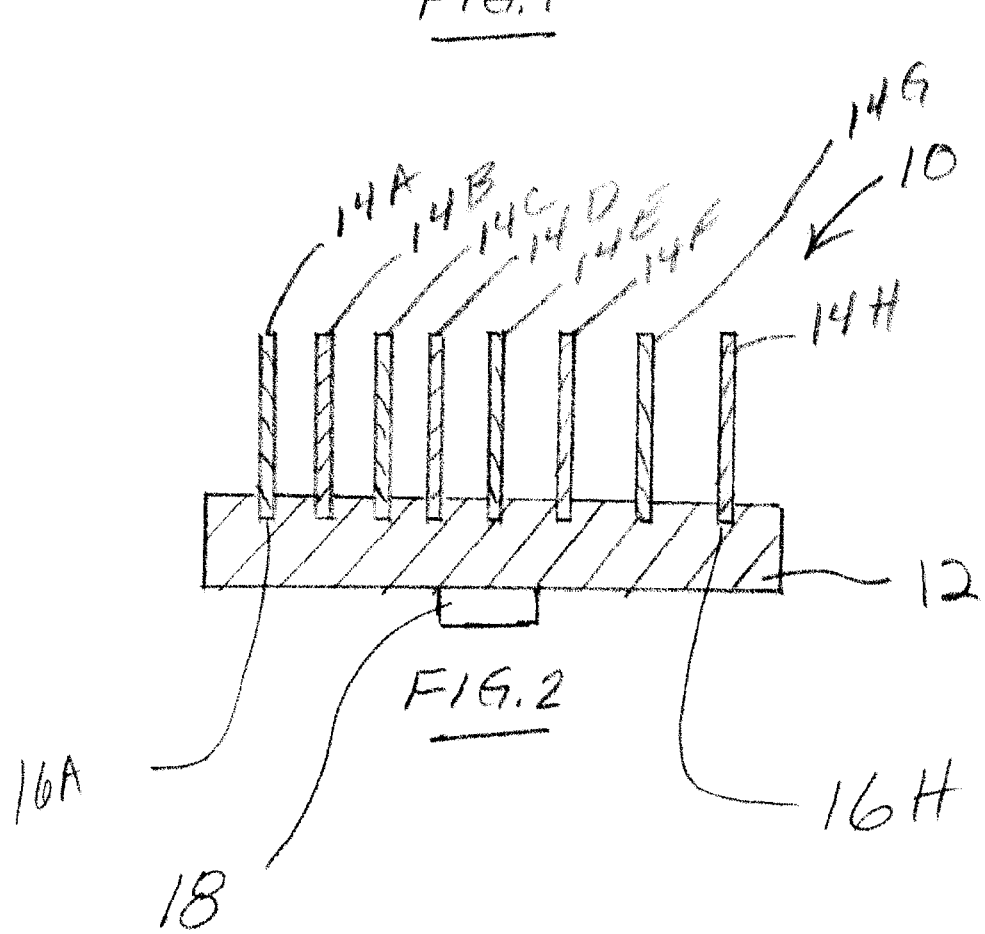
FIG. 2 is an elevation section view taken along line 2—2 of FIG. 1.

The Detailed Embodiment of FIGS. 1–2

Referring now to the drawings, and particularly to FIGS. 1 and 2, a heat sink apparatus is shown and generally designated by the numeral 10. The heat sink apparatus 10 includes a metal base 12 having a thermal conductivity of at least 200 W/m°K. Preferably the metal base 12 is constructed of either copper or aluminum. A copper base 12 will have a thermal conductivity of approximately 391 W/m°K. An aluminum metal base 12 will have a thermal conductivity of approximately 209 W/m°K.

The heat sink apparatus 10 further includes a plurality of fins such as 14A–H.

The fins 14 are constructed of flexible graphite sheet material, and preferably are constructed from a resin-impregnated laminate of flexible graphite sheets.

As previously noted, the graphite sheet material is anisotropic and has a relatively high thermal conductivity of approximately 400 W/m°K in the plane of the sheet, and has a very much lower thermal conductivity across the thickness of the sheet. Thus, the fins when constructed of the sheet material have a relatively high thermal conductivity within the plane of the fin which is generally perpendicular to the orientation of the base 12.

The graphite material from which the fins are constructed is considerably lighter than a comparable size copper fin, and is also lighter than a comparable size aluminum fin. Pure copper weighs 8.96 gm/cm$^3$ and pure aluminum weighs 2.70 gm/cm$^3$. The density of the graphite sheet material, on the other hand, can be within the range of from about 0.04 gm/cm$^3$ to about 2.0 gm/cm$^3$. The preferred laminated resin-impregnated graphite material described above has a density of approximately 1.94 gm/cm$^3$.

Thus when using a copper base 12, with the graphite fins 14, the heat sink apparatus 10 will have a thermal performance approximately equal to that of an all copper heat sink while having a weight less than that of the all copper heat sink.

Similarly, when utilizing an aluminum base 12 with the graphite fins 14, the heat sink apparatus 10 will have a thermal performance greater than that of a similar size all aluminum heat sink while having a weight of less than and certainly no greater than that of an all aluminum heat sink.

Preferably, the fins 14 are attached to the base 12 by machining a plurality of grooves such as 16A–H in the base 12, with the fins 14 each having their lower edges closely received within the respective groove 16.

The fins 14 may be held in place within the groove 16 by a friction fit, a thermal shrink fit, or by the use of adhesive.

An electronic device 18 which is to be cooled by the heat sink apparatus 10 is schematically illustrated in FIG. 2 and engages the lower surface of the base 12. The electronic device 18 may be thermally connected to the base 12 by a layer of thermal grease or adhesive or by a thermal interface layer constructed of a thin sheet of graphite material.

Thus it is seen that the apparatus of the present invention readily achieves the ends and advantages mentioned as well as those inherent therein. While certain preferred embodiments of the invention have been illustrated and described for purposes of the present disclosure, numerous changes in the arrangement and construction may be made by those skilled in the art, which changes are encompassed within the scope and spirit of the present invention as defined by the appended claims.

What is claimed is:

1. A heat sink apparatus, comprising:

a metal base having a thermal conductivity of at least about 200 W/m°K; and a plurality of fins attached to the base, the fins being constructed of a resin impregnated laminate of sheets of compressed particles of exfoliated graphite cured at an elevated temperature and pressure.

2. The apparatus of claim 1, wherein the fins are perpendicular to the base.

3. The apparatus of claim 1, wherein the base is constructed of copper.

4. The apparatus of claim 1, wherein the base is constructed of aluminum.

5. The apparatus of claim 1, wherein:

the base has a plurality of parallel grooves formed therein; and the fins are planar fins, each of the fins being closely received in one of the grooves.

6. A heat sink apparatus, comprising:

a copper base; and a plurality of graphite fins attached to the base, the fins each comprising a resin impregnated laminate of sheets of compressed particles of exfoliated graphite cured at an elevated temperature and pressure, the graphite fins being planar and having a relatively high thermal conductivity within the plane of the fin and relatively low thermal conductivity across a thickness of each fin.

7. The apparatus of claim 6, wherein:

the base has a plurality of parallel grooves formed therein, each of the fins being closely received in one of the grooves.

8. A heat sink apparatus, comprising:

an aluminum base; and a plurality of graphite fins attached to the base, the graphite fins being formed of a resin-impregnated laminate of sheets of compressed particles of exfoliated graphite cured at an elevated temperature and pressure, the fins exhibiting thermal conductivity greater than that of aluminum in the plane of the sheet and having a relatively low thermal conductivity across a thickness of the sheet material, the graphite fins having a specific gravity no greater than that of aluminum.

9. The apparatus of claim 8, wherein:

the base has a plurality of parallel grooves formed therein; and the fins are planar fins, each of the fins being closely received in one of the grooves.

10. The apparatus of claim 9, wherein the laminate is cured at a temperature of at least about 150° C. and a pressure of at least about 1000 pounds per square inch.

* * * * *